United States Patent
Chou et al.

(10) Patent No.: US 6,429,082 B1
(45) Date of Patent: Aug. 6, 2002

(54) METHOD OF MANUFACTURING A HIGH VOLTAGE USING A LATID PROCESS FOR FORMING A LDD

(75) Inventors: Jin-Tau Chou, Pingtung Hsien; Chung-Chiang Lin, Hsinchu Hsien; Chih-Jen Huang, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 7 days.

(21) Appl. No.: 09/684,118

(22) Filed: Oct. 6, 2000

(30) Foreign Application Priority Data

Sep. 26, 2000 (TW) .......................................... 89119794 A

(51) Int. Cl.[7] ........................................... H01L 21/265
(52) U.S. Cl. ................................................... 438/303
(58) Field of Search ............................... 438/302, 303, 438/199, 902

(56) References Cited

U.S. PATENT DOCUMENTS

| | | | | |
|---|---|---|---|---|
| 5,218,221 A | * | 6/1993 | Okumura | 257/336 |
| 5,362,982 A | * | 11/1994 | Hirase et al. | 257/408 |
| 5,409,848 A | * | 4/1995 | Han et al. | 438/302 |
| 5,466,957 A | * | 11/1995 | Yuki et al. | 257/366 |
| 5,606,191 A | * | 2/1997 | Wang | 257/344 |
| 5,631,485 A | * | 5/1997 | Wei et al. | 438/264 |

* cited by examiner

Primary Examiner—Richard Elms
Assistant Examiner—Beth E. Owens
(74) Attorney, Agent, or Firm—J.C. Patents

(57) ABSTRACT

A method of manufacturing a high voltage device is described. A well region is formed within a substrate of a high voltage device region. A gate structure is made up of a gate oxide layer, a gate and an optional cap layer that are sequentially formed upon the well. Subsequently, using the gate structure as a mask, a large tilt angle light doping process is performed on the well of the high voltage device region of the well, thereby forming a lightly doped source and drain region. Thereupon, a optional thermal drive-in procedure is performed. Next, a spacer is formed on the side of the gate structure. Using the spacer and the gate structure as a mask, a heavy doping self-aligned ion implantation process is performed on the active region of the well, thereby forming a heavily doped source and drain region.

8 Claims, 3 Drawing Sheets

METHOD OF MANUFACTURING A HIGH VOLTAGE USING A LATID PROCESS FOR FORMING A LDD

CROSS-REFERENCE TO RELATED APPLICATION

This application claims the priority benefit of Taiwan application Ser. No. 89119794, filed Sep. 26, 2000.

BACKGROUND OF THE INVENTION

1. Field of the Invention

The present invention relates to a method of manufacturing a semiconductor device. More particularly, the present invention relates to a method of manufacturing a high voltage device that raises the breakdown voltage.

2. Description of the Related Art

Recently, the goal in the development of the semiconductor industry is to increase the integration of the integrated circuit. However, when the device is gradually reduced in size, the breakdown voltage also decreases correspondingly. Therefore, in the design of a semiconductor high voltage device, raising of the breakdown voltage must be considered. Generally, the integrated circuit device includes some high voltage devices, such as an electrically programmable read-only memory (EPROM) or a flash memory.

In the semiconductor processing of the related art, in order to increase the breakdown voltage of the junction between a MOSFET (metal oxide semiconductor field effect transistor) and a well, usually a lightly doped offset region is added surrounding the source/drain region, in order to raise the junction breakdown voltage.

FIGS. 1A and 1B are flow diagrams in cross-sectional view illustrating a method of manufacturing high voltage device. Referring to FIG. 1A, a P-type substrate 100 is provided. By using an ion implantation process, a doped implanted substrate required by the P-well 102 is formed, and a gate structure 110 made up of a gate oxide layer 104, a gate 106, and an optional cap layer 108 are formed over the P-well in sequence.

Referring to FIG. 1B, by using the gate structure 110 as a mask, an N⁻ ion implantation procedure is performed on the high voltage device region of the P-well 102, thereby forming lightly doped regions 112a and 112b.

Referring to FIG. 1C, a spacer 114 is formed on the sidewall of the gate structure 110. Next, an offset mask 116 is formed on the P-well 102. Subsequently, by using the offset mask 116 as an implantation mask, an N⁺ ion implantation procedure is performed on the P-well 102, thereby forming source/drain regions 118a and 118b. Directly across from the position of the gate structure, the source/drain regions 118a and 118b move laterally, offsetting the length L. Lightly doped offset regions 112a and 112b are formed around the source/drain regions 118a and 118b. The formation of the lightly doped offset regions 112a and 112b reduces the electric field intensity gradient at the drain region 118 and the P-well 102 junction, thereby raising the breakdown voltage.

With regards to the high voltage metal oxide semiconductors (MOS) field effect transistors (FETs), if there are spaces between the lightly doped offset regions 112a, 112b and the gate 106, then the electric current does not flow easily, and causes an attack on the characteristics of the output current. Consequently, the procedure of forming the lightly doped regions 112a and 112b should prioritize the procedure of forming the spacer 114.

In the manufacturing of the semiconductor high voltage device in the related art, the offset length L is roughly in direct proportion to the breakdown voltage, and the longer the offset length L is, the higher the breakdown voltage is. However, increasing the length of the offset length L causes difficulties in reducing the device size.

SUMMARY OF THE INVENTION

The present invention provides a method of manufacturing a high voltage device, to be used to raise the breakdown voltage of the device, enabling the device to withstand high voltage operations, and to meet the requirements of reduced size and increased integration.

As embodied and broadly described herein, the invention provides a method of manufacturing a high voltage device that raises the breakdown voltage. First, a semiconductor substrate with a high voltage device region is provided, and an oxide layer is formed on the semiconductor substrate. Next, a well region is formed on the semiconductor substrate, and the oxide layer is removed. Subsequently, a gate oxide layer is formed on the well region. A gate and an optional cap layer are sequentially formed on the substrate. Hence, the gate oxide layer, the gate and the cap layer together make up the gate structure. Next, a light doping process is performed, wherein the light doping process uses the gate structure as a mask to perform an ion implantation process at a great tilt angle on the high voltage device region of the well region. Thus, a lightly doped region is formed and the lightly doped region extends out to the well region below the gate. After the ion implantation process, an optional process of dopant thermal drive-in is continued, thereby widening the area of the lightly doped region below the gate. Next, a spacer is formed on the sidewall of the gate structure. Subsequently, using the gate structure and the spacer as a mask, a heavy doping process is performed on the well, thereby forming a source/drain region.

According to one method of manufacturing a high voltage device provided in the present invention, the breakdown voltage of the device can be increased, enabling the device to withstand high voltage operations, and simultaneously meeting the requirements of reduced size and increased integration. Moreover, after performing an ion implantation at a large tilt angle, the channel length of the device is effectively reduced, and the device saturation current can be raised, thereby causing the device to operate quickly. There is no offset mask in the process flow of this present invention. Hereby, the cost of the process is reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and, together with the description, serve to explain principles of the invention. In the drawings.

DESCRIPTION OF THE PREFERRED EMBODIMENTS

FIGS. 2A to 2D are flow diagrams in cross-sectional view of a method of manufacturing a high voltage device, according to one preferred embodiment of this invention.

Figure 1A:
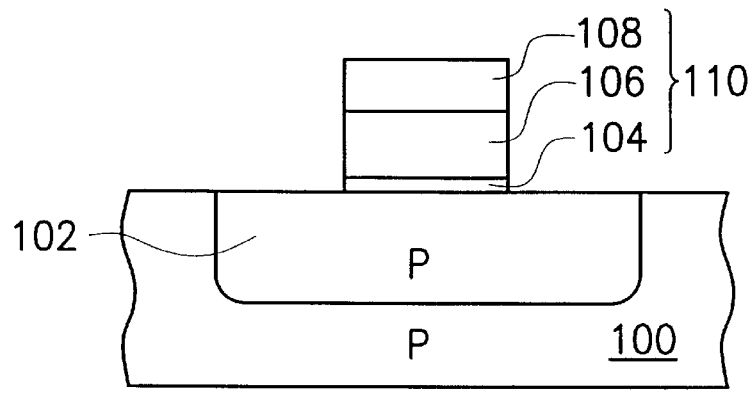
FIGS. 1A to 1C are flow diagrams in cross-sectional view of a method of manufacturing a high voltage device in the related art.
Figure 1B:
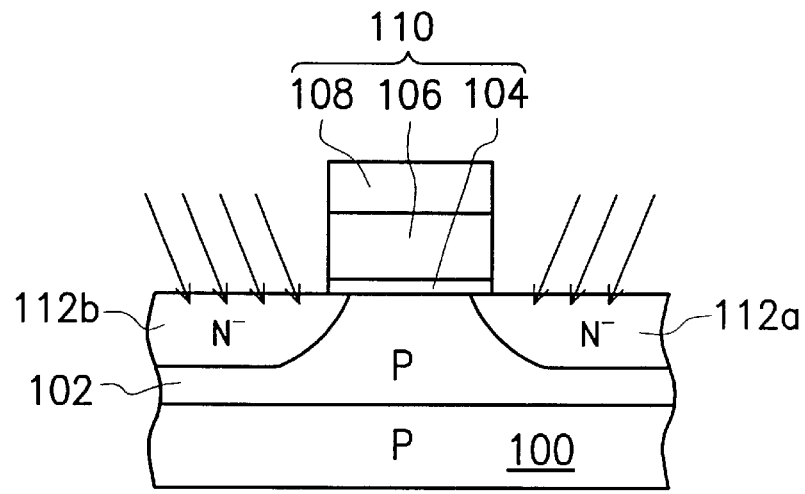
Figure 1C:
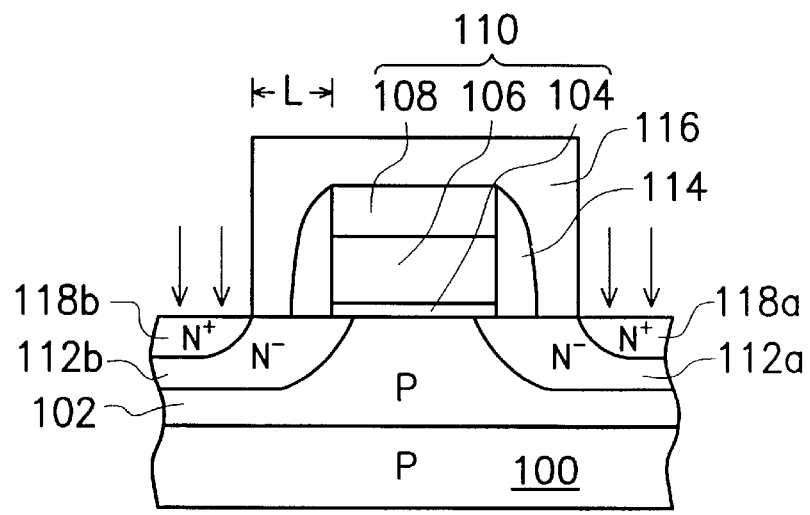
Figure 2A:
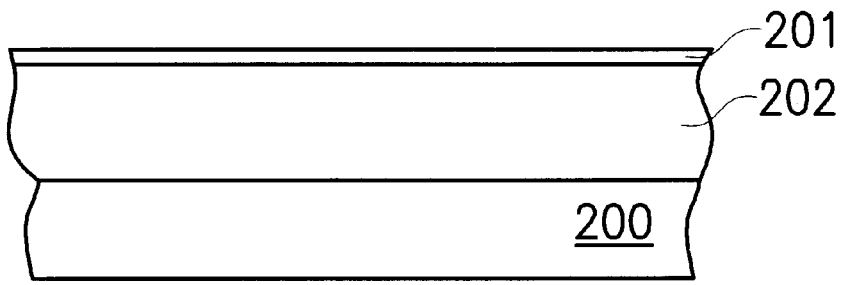
FIGS. 2A to 2D are flow diagrams in cross-sectional view of a method of manufacturing a high voltage device, according to one preferred embodiment of this invention.

Referring to FIG. 2A, an oxide layer 201 is formed on a substrate 200 such as a P-type substrate. Next, a well region 202 is formed within the substrate 200 by a process such as implantation of a P-type dopant into the substrate 200 through use of a P-well mask (not illustrated).

Figure 2B:
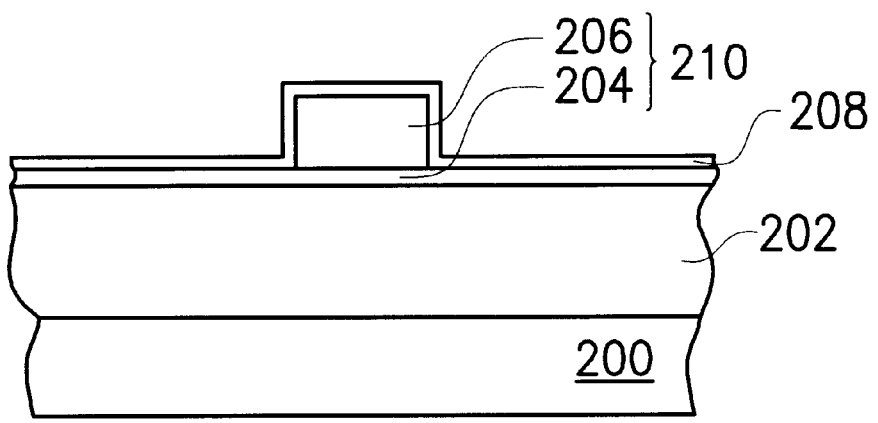

Referring to FIG. 2B, after the oxide layer 201 is removed, a gate oxide layer 204 is formed on the P-well 202. A gate 206 and an optional cap layer 208 are formed over the gate oxide layer 204 in sequence. The gate 206 can be made of a material such as polysilicon. The gate oxide layer 204, the gate 206 and the optional cap layer 208 altogether make up a gate structure 210.

Figure 2C:
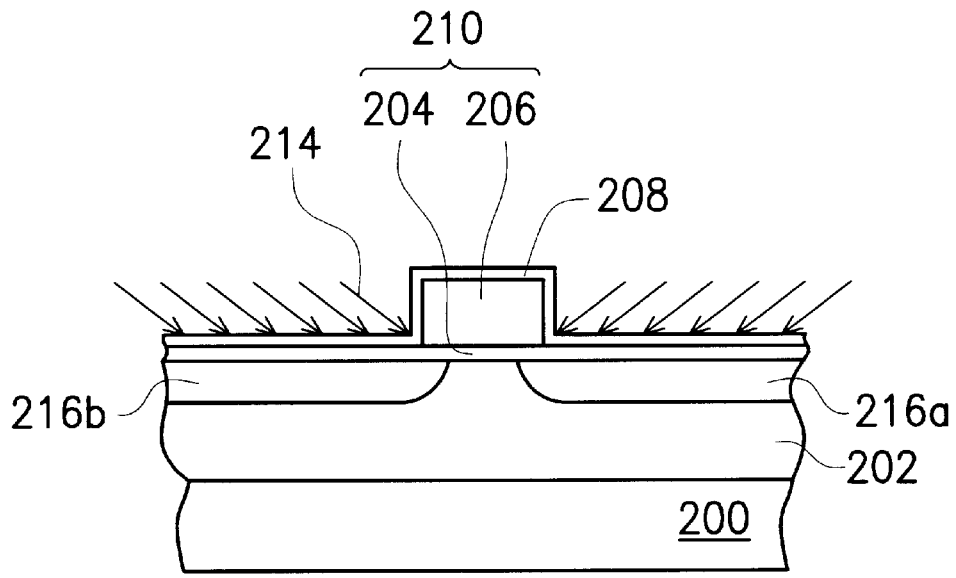

Referring to FIG. 2C, a first ion implantation process 214 is performed on the P-well 202 at a large tilt angle. In the present process, the dopant type of ions implanted in the first ion implantation process and the dopant type of the well region are different. For example, the present embodiment uses a P-well and the first ion implantation can be an N-type ion implantation by implanting, for example, phosphorus ions. An appropriate ion implantation dosage and an ion implantation energy level are selected for the light doping process, thereby forming lightly doped regions 216a and 216b within the well region 202. The lightly doped regions 216a and 216b extend out to the well region 202 below the gate structure 210. After the ion implantation process, an optional thermal drive-in procedure is performed, thereby causing the ions to further extend out to the well region 202 below the gate structure 210. Thereupon, when performing the first ion implantation at a large tilt angle, the ions are implanted at an angle greater than 30°.

Figure 2D:
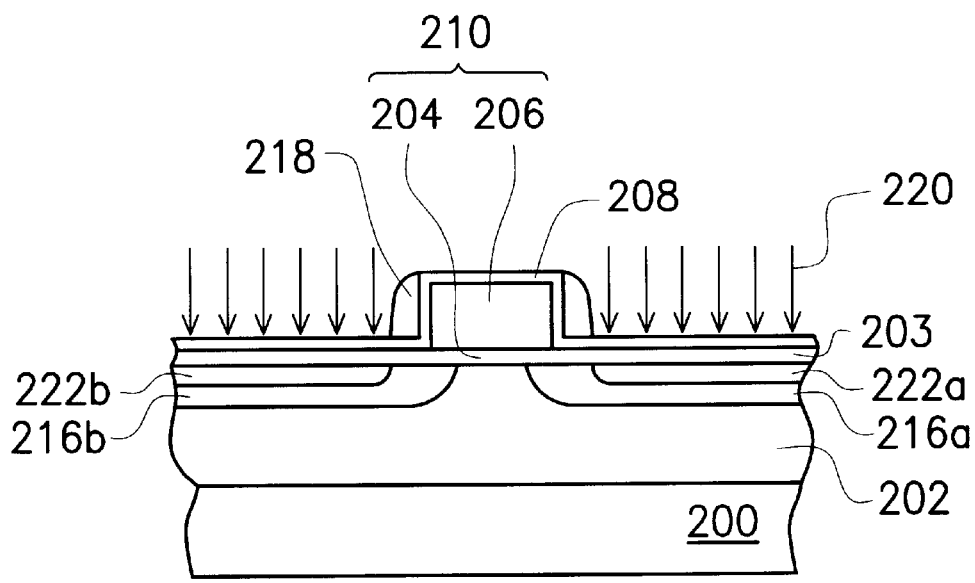

Referring to FIG. 2D, a spacer 218 is formed on the sidewall of the gate structure 210. The spacer 218 and the gate structure 210 are used as a mask, and a self-aligned second ion implantation process 220 is performed on the P-well 202, thereby forming a heavily doped region. The heavily doped region serves as the source/drain regions 222a and 222b for the device. The dopant type of the ions implanted during the second ion implantation process 220 and the dopant type of the ions implanted during the first ion implantation process 214 are the same, for example, implanted ions can both be phosphorus ions. The dopant concentration of the source/drain regions 222a and 222b is higher than the dopant concentration of the lightly doped regions 216a and 216b.

In the above-described preferred embodiment of the present invention, the ion implantation process is performed on the well at a large tilt angle. Thus, a lightly doped region is formed within the well region, surrounds the source/drain region, and also enables the lightly doped region to extend out to the well region below the gate structure. Through the formation of the lightly doped region, the voltage distribution is changed, and reduces the electric field gradient at the junction of the drain region and the well region. Consequently, the breakdown voltage of the device can be raised and enables the device to withstand high voltage operations. Also, since the offset mask layer is not needed to laterally move the source/drain region, the process is simplified, and can suit the trend of device size reduction. In addition, after performing ion implantation at a large tilt angle, the device can effectively reduce the length of the channel, and raises the saturation current of the device, thereby causing the device to operate quickly.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a high voltage device, comprising:

providing a P-type substrate;

forming an oxide layer on the P-type substrate;

performing an ion implantation process through the oxide layer to form a P-well region within the P-type substrate;

removing the oxide layer;

forming a gate oxide layer over the P-well region;

forming a gate on the gate oxide layer;

forming an optional cap layer on the gate;

covering a patterned implantation mask layer on the substrate, exposing a defined position of a high voltage device region; and performing a large tilt angle $N^-$ ion implantation process on the P-well region, thereby forming a lightly doped region within the P-well region;

performing a thermal drive-in procedure so that the implanted ions further laterally extend in the P-well region under the gate, forming a spacer on a sidewall of the gate; and using the gate and the spacer as a mask, performing a self-aligned N+ ion implantation process on the P-well region, thereby forming a source/drain region.

2. The method of manufacturing a high voltage device as defined in claim 1, wherein the large tilt angle is greater than 30°.

3. A method of manufacturing a high voltage device, comprising:

providing a substrate;

forming a well region within the substrate;

forming a gate structure on the well region;

performing a large tilt angle ion implantation process, thereby forming a lightly doped region within the well region;

performing a thermal drive-in procedure so that the implanted ions further laterally extend in the well region under the gate;

forming a spacer on a sidewall of the gate structure; and using the gate structure and the spacer as a mask, performing a self-aligned ion implantation process on the well, thereby forming a heavily doped region, wherein the heavily doped region serves as a source/drain region.

4. The method of manufacturing a high voltage device as defined in claim 3, wherein a dopant type of the substrate and a dopant type of the well region are the same.

5. The method of manufacturing a high voltage device as defined in claim 3, wherein a dopant type of the substrate and a dopant type of the well region are different.

6. The method of manufacturing a high voltage device as defined in claim 3, wherein a dopant type of the lightly doped region and a dopant type of the well region are different.

7. The method of manufacturing a high voltage device as defined in claim 3, wherein a dopant type of the lightly doped region and the dopant type of the heavily doped region are the same.

8. The method of manufacturing a high voltage device as defined in claim 3, wherein the tilt angle is greater than 30°.

* * * * *